United States Patent
Moll et al.

(10) Patent No.: US 9,391,156 B2
(45) Date of Patent: Jul. 12, 2016

(54) EMBEDDED CAPACITOR

(71) Applicant: GLOBALFOUNDRIES Inc., Grand Cayman (KY)

(72) Inventors: Hans-Peter Moll, Dresden (DE); Peter Baars, Dresden (DE); Jan Hoentschel, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 14/471,546

(22) Filed: Aug. 28, 2014

(65) Prior Publication Data

US 2016/0064471 A1 Mar. 3, 2016

(51) Int. Cl.
*H01L 49/02* (2006.01)
*H01L 21/28* (2006.01)
*H01L 29/49* (2006.01)
*H01L 27/06* (2006.01)
*H01L 23/522* (2006.01)

(52) U.S. Cl.
CPC ...... *H01L 29/4983* (2013.01); *H01L 21/28088* (2013.01); *H01L 21/28105* (2013.01); *H01L 21/28132* (2013.01); *H01L 23/5223* (2013.01); *H01L 27/0629* (2013.01); *H01L 28/86* (2013.01); *H01L 29/4966* (2013.01)

(58) Field of Classification Search
CPC . H01L 27/0805; H01L 27/0629; H01L 29/49; H01L 21/28088; H01L 21/28132; H01L 28/40; H01L 29/4966; H01L 29/4983; H01L 29/4708; H01L 28/60; H01L 21/2808; H01L 21/28105; H01L 23/5223; H01L 28/86
See application file for complete search history.

(56) References Cited

U.S. PATENT DOCUMENTS

| | | | |
|---|---|---|---|
| 7,271,083 B2* | 9/2007 | Tu | H01L 27/10861 257/E21.011 |
| 2011/0215390 A1* | 9/2011 | Kim et al. | 257/306 |
| 2013/0146959 A1* | 6/2013 | Cheng et al. | 257/310 |
| 2014/0291748 A1* | 10/2014 | Kanda | H01L 27/11517 257/316 |

* cited by examiner

*Primary Examiner* — Jasmine Clark
(74) *Attorney, Agent, or Firm* — Amerson Law Firm, PLLC

(57) ABSTRACT

A method of manufacturing a semiconductor device is provided, including forming a gate electrode of a dummy transistor device on a semiconductor substrate, forming a high-k material layer over and adjacent to the gate electrode and forming a metal layer on the high-k material layer over and adjacent to the gate electrode to form a capacitor.

24 Claims, 6 Drawing Sheets

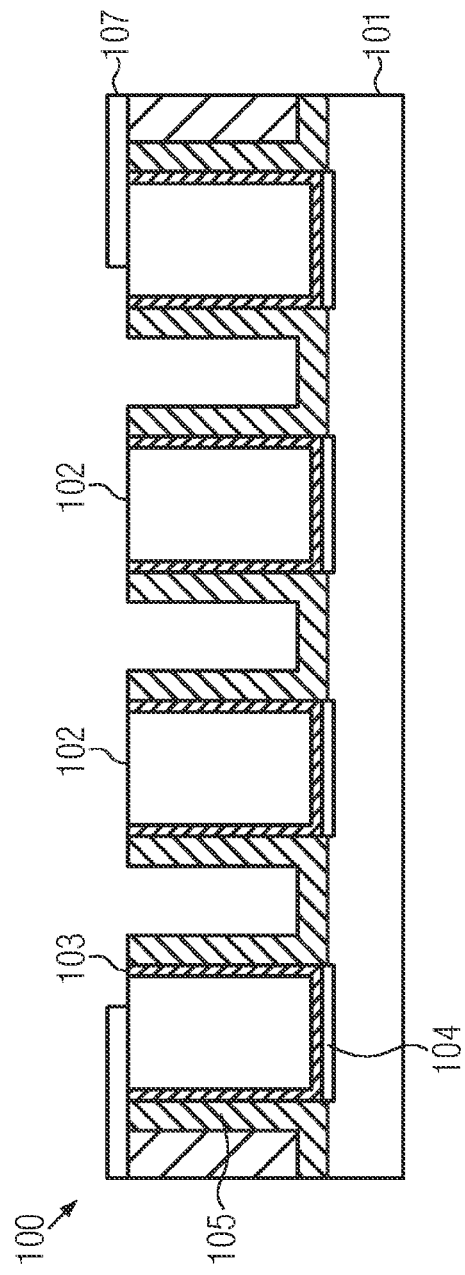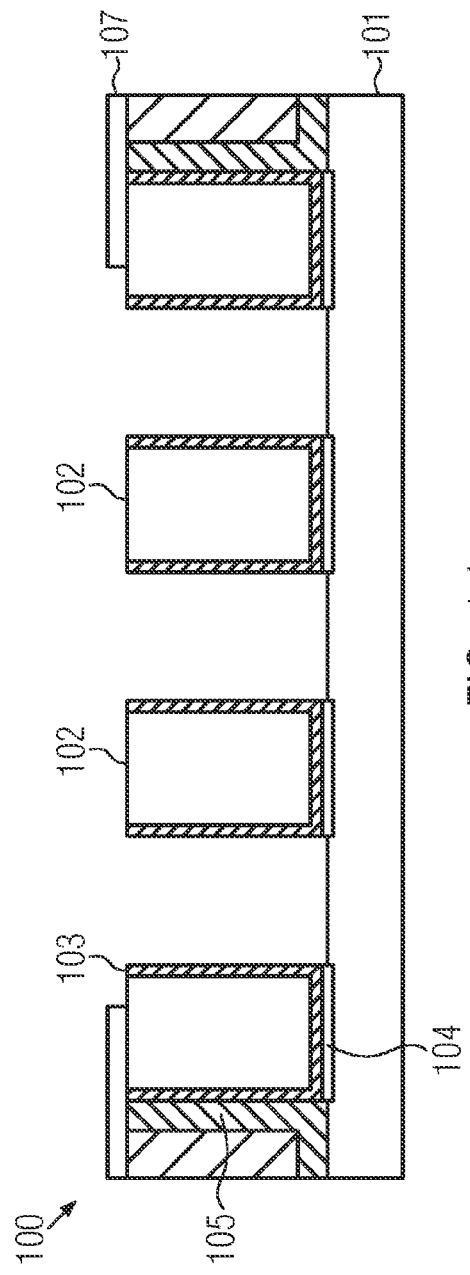

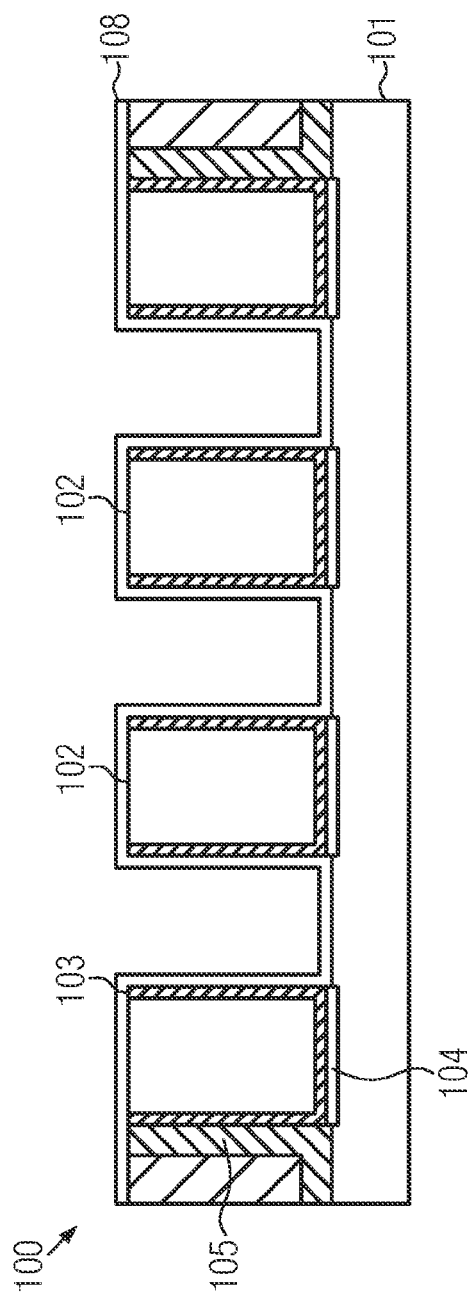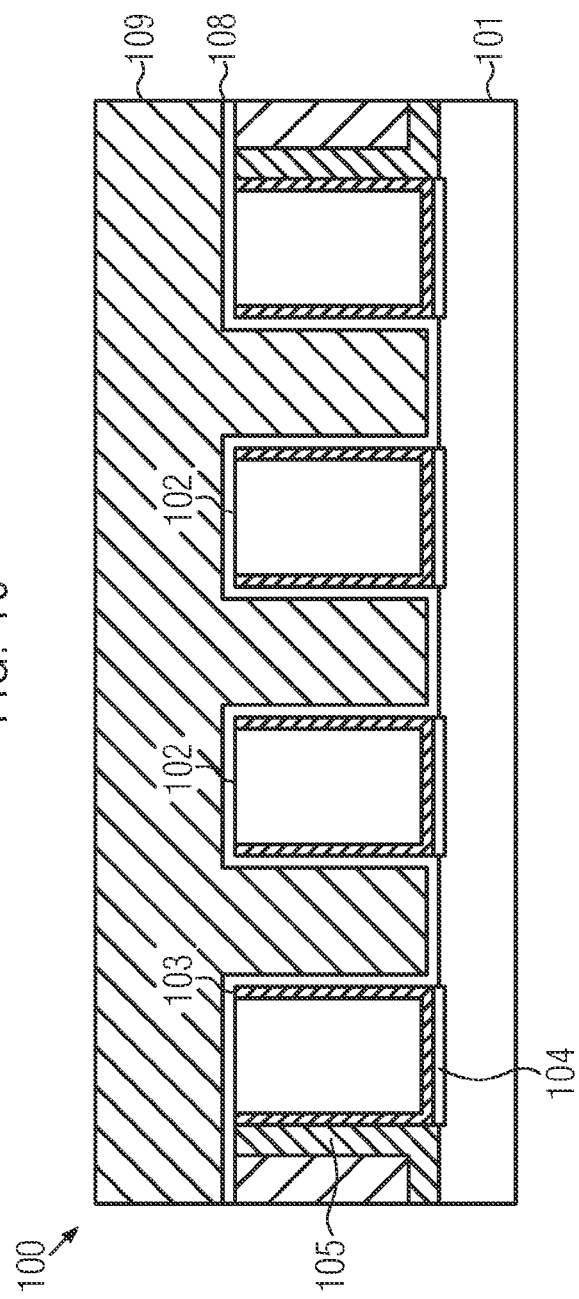

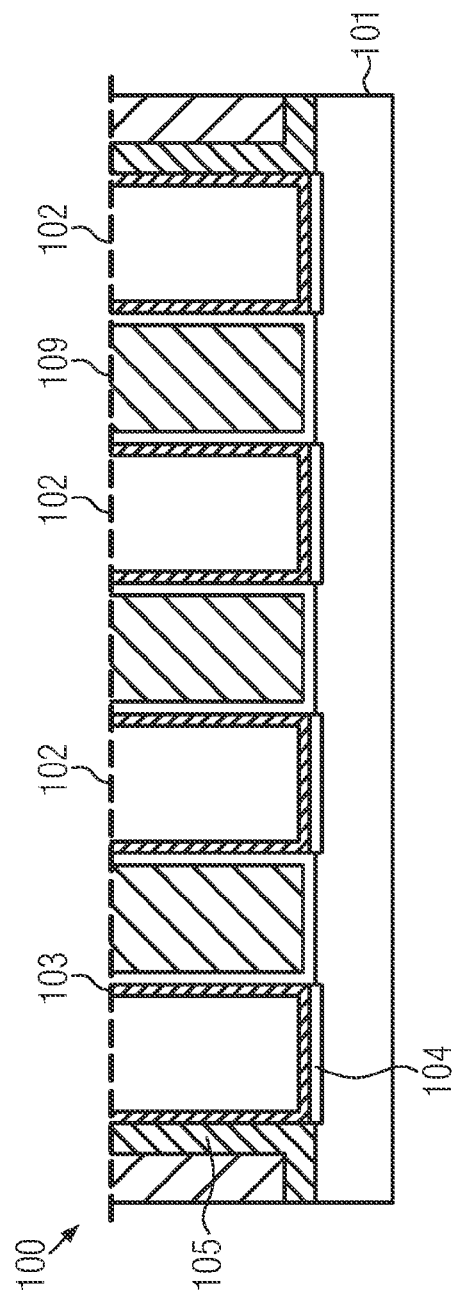
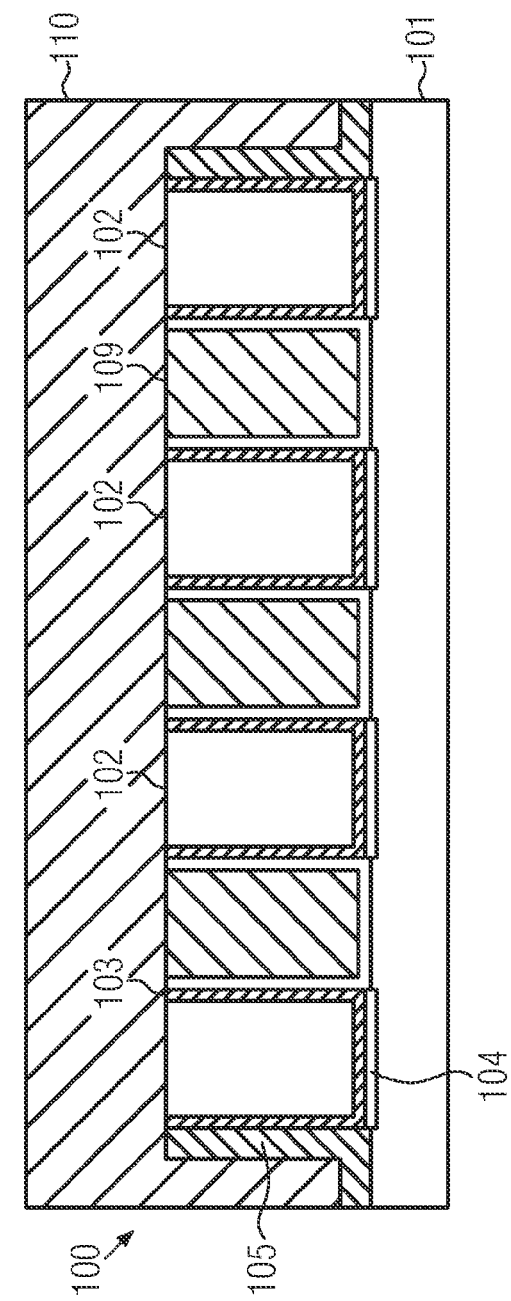
FIG. 1g
FIG. 1h

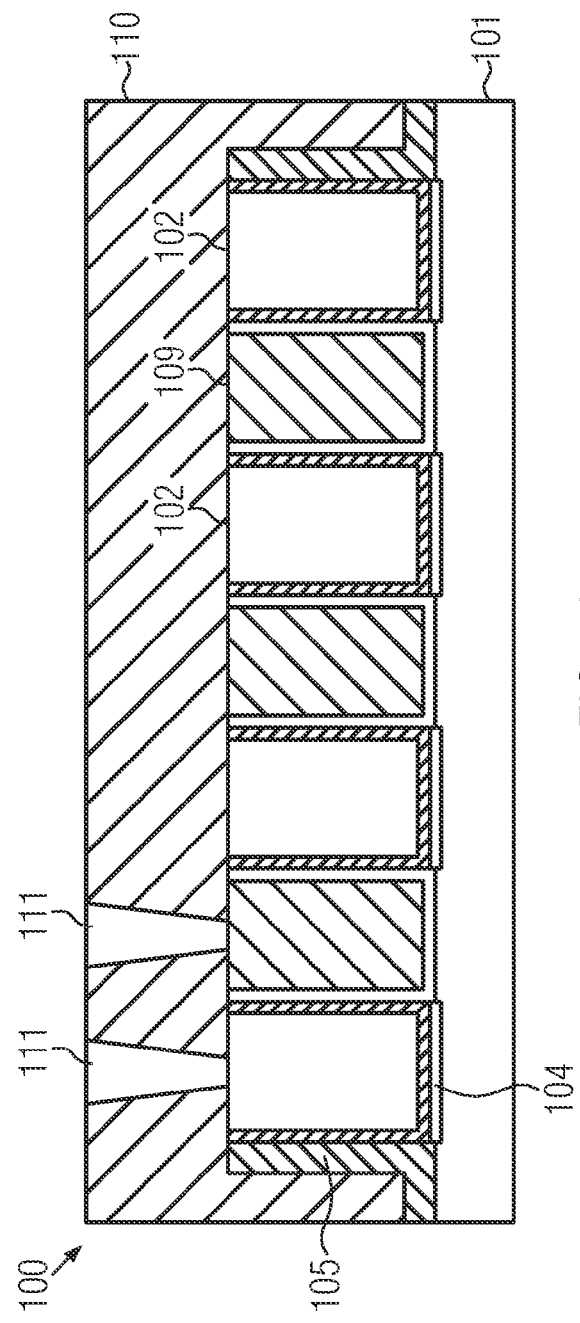
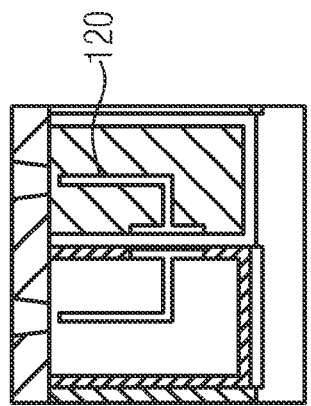
FIG. 1i
FIG. 1j

# EMBEDDED CAPACITOR

BACKGROUND OF THE INVENTION

1. Field of the Invention

Generally, the present disclosure relates to the field of integrated circuits, and, in particular, to embedded capacitors.

2. Description of the Related Art

Integrated circuits typically include a large number of circuit elements, which form an electric circuit. In addition to active devices such as, for example, field effect transistors and/or bipolar transistors, integrated circuits may include passive devices such as resistors, inductors and/or capacitors.

As integration density of semiconductor devices increases, the area occupied by individual devices continues to shrink. Notwithstanding this, a capacitor for storing data of, for instance, a dynamic random access memo (DRAM) is required to have a sufficient capacitance, irrespective of the decrease in the area occupied by the capacitor. In addition to so-called native capacitors, which make use of the native or "parasitic" inter-metal capacity between metal lines in integrated circuits, there are metal-insulator-metal (MIM) capacitors. Accordingly, a metal-insulator-metal (MIM) capacitor, in which a lower electrode and an upper electrode are formed of metal and separated by a layer of insulating material, is being used in many integrated circuit products. Metal-insulator-metal capacitors may be used in CMOS, BICMOS and bipolar integrated circuits. Typical applications of metal-insulator-metal capacitors include filter and analog capacitors, for example, in analog-to-digital converters or digital-to-analog converters, decoupling capacitors, radio frequency coupling and radio frequency bypass capacitors in radio frequency oscillators, resonator circuits, and matching networks. Additionally, MIM capacitors have been used extensively in semiconductor devices that perform analog-to-digital conversions and digital-to-analog conversions. Conversion between analog and digital signals requires that capacitors employed in such conversion be stable, i.e., the capacitance of the capacitors must be relatively stable over a range of applied voltages and temperatures. The capacitance of capacitors with polysilicon electrodes tends to be relatively unstable since the capacitor structures tend to vary with changes in temperature and applied voltage. Accordingly, capacitors with polysilicon electrodes are typically not used for such conversion applications Metal-insulator-metal capacitors may be provided in additional interconnect levels, which are provided in addition to interconnect levels wherein electrically conductive lines connecting active circuit elements of integrated circuits, such as, for example, transistors, are provided.

Key attributes of metal-insulator-metal capacitors may include a relatively high linearity over relatively broad voltage ranges, a relatively low series resistance, relatively good matching properties, relatively small temperature coefficients, relatively low leakage currents, a relatively high breakdown voltage and a sufficient dielectric reliability.

Techniques for forming metal-insulator-metal capacitors may include a deposition of a metal-insulator-metal stack on a planarized surface of a semiconductor structure and a patterning of the metal-insulator-metal stack. The metal-insulator-metal stack may include a bottom electrode layer, a dielectric layer and a top electrode layer. The metal-insulator-metal stack may be patterned by means of a photolithography process. However, the absorption and/or reflection of light by the metal-insulator-metal stack is largely depending on the materials used and the thicknesses of the layers in the metal-insulator-metal stack. Thus, there are limited material combinations that enable optical alignment through the metal-insulator-metal stack.

In forming the upper and lower metal electrodes of a MIM capacitor, an etching process is typically performed to pattern a metal layer. However, as the integration density of semiconductor devices continues to increase, it is becoming more difficult to etch such metal layers. In particular, copper, which has good electromigration resistance and a desirable low resistivity, may be difficult to etch. Accordingly, various methods for forming the upper and lower metal electrodes through a damascene process, that is, a process which does not involve etching a metal layer, have been proposed. A copper damascene process generally includes forming a trench for a copper structure in an insulation layer, forming a sufficient amount of copper to overfill the trench and removing the excess copper from the substrate, thereby leaving the cooper structure in the trench. However, the damascene process used in forming copper-based capacitors and conductive lines and vias is time-consuming and expensive, and includes many steps, where chances for creating undesirable defects always exist.

Moreover, capacitors of the art suffer from the following problems. Vertical natural capacitors and finger metal-oxide-metal capacitors show insufficient capacitance due to low values of the dielectric constants of the used ultra-low-k dielectrics that, in principle, require large areas to provide significant capacitance anyway. The voltage of lateral capacitor, on the other hand, is limited, in principle, by the operation reliability of the employed ultra-low-k dielectrics.

The present disclosure provides enhanced capacitor structures and manufacturing processes for the same wherein the above-mentioned issues may be properly addressed and the mentioned problems of the art may be overcome or at least alleviated.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method of manufacturing a semiconductor device includes the steps of forming a gate electrode of a dummy transistor device on a semiconductor substrate, forming a high-k material layer over and adjacent to the gate electrode and forming a metal layer on the high-k material layer over and adjacent to the gate electrode to form a capacitor.

Herein, the term "dummy transistor" denotes a structure that is formed during a conventional manufacturing process of transistor devices on a wafer but not functioning as a transistor, since, for example, it has no source/drain regions formed. The gate electrode of a dummy transistor is a non-device gate in the sense that it is not the gate electrode of a functioning transistor (but rather merely forms a capacitor electrode according to examples of the present disclosure).

Furthermore, a method of forming a capacitor is provided. The method includes forming a gate dielectric on a semiconductor substrate, forming a dummy gate electrode on the gate dielectric and forming sidewall spacers at sidewalls of the dummy gate electrode. Moreover, the dummy gate electrode is subsequently removed, thereby forming an opening between the sidewall spacers. In addition, the method includes the steps of forming a work function adjusting layer in the opening, forming a gate electrode on the work function adjusting layer, removing the sidewall spacers, forming a high-k material layer on the work function adjusting layer over sidewalls of the gate electrode and forming a metal layer on the high-k material layer over and adjacent to the gate electrode to form a capacitor. The gate electrode is, particularly, the gate of a dummy transistor.

The above-mentioned method steps may be steps of an overall processing comprising the formation of transistor devices.

Additionally, a semiconductor device is provided comprising a capacitor, a dummy transistor comprising a gate electrode, a high-k material layer covering the gate electrode and a metal layer formed on the high-k material layer.

In the above-mentioned examples the high-k material may have a dielectric constant of at least 5 or at least 10. A capacitor is formed by the gate electrode as a first capacitor electrode, the metal layer as a second capacitor electrode and the high-k material layer as the capacitor insulator. Moreover, a work function adjusting layer, for example, comprising a transition metal nitride, formed on the gate electrode may be part of the capacitor insulator.

BRIEF DESCRIPTION OF THE DRAWINGS

The disclosure may be understood by reference to the following description taken in conjunction with the accompanying drawings, in which like reference numerals identify like elements, and in which:

FIGS. 1a-1j show schematic cross-sectional views of a semiconductor structure in particular stages of a manufacturing method according to an example of the present disclosure.

Figure 1A:
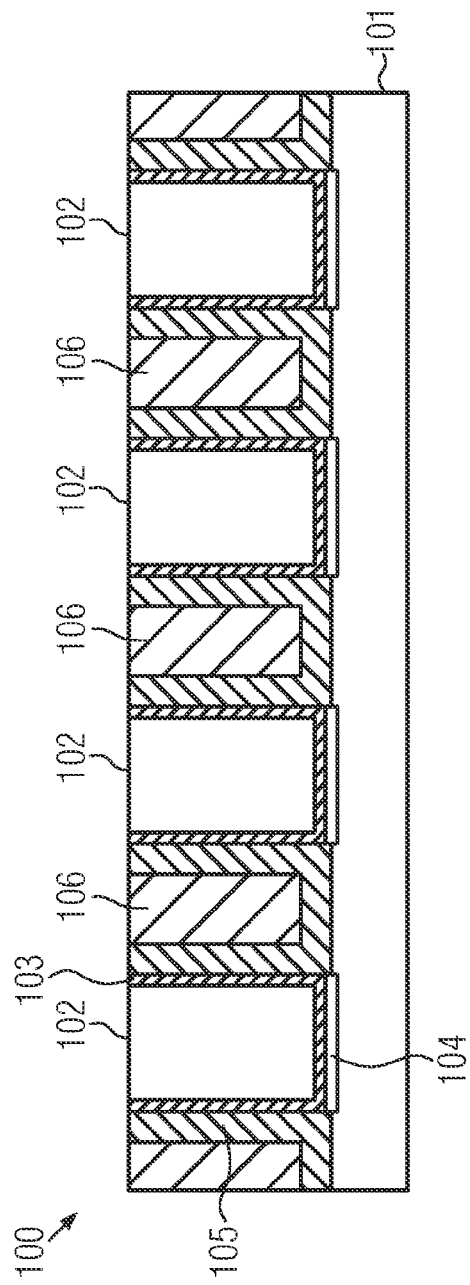

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure provides methods for forming a capacitor, in particular, in the context of a replacement gate technique for forming transistor devices. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. The techniques and technologies described herein may be utilized to fabricate MOS integrated circuit devices, including NMOS integrated circuit devices, PMOS integrated circuit devices and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

FIG. 1a shows an exemplary starting point for illustrating a method of forming a capacitor according to the present disclosure. A semiconductor structure 100 may include a substrate 101. In some embodiments, the semiconductor substrate 101 may include a bulk semiconductor substrate formed of a semiconductor material, for example, a silicon wafer or silicon die. In other embodiments, the substrate 101 may include a semiconductor-on insulator substrate including a layer of a semiconductor material, for example, a silicon layer, that is formed above a support substrate, which may be a silicon wafer, and is separated therefrom by a layer of an electrically insulating material, for example, a silicon dioxide layer. The substrate 101 may include a semiconductor layer, which in turn may be comprised of any appropriate semiconductor material, such as silicon, silicon/germanium, silicon/carbon, other II-VI or III-V semiconductor compounds and the like.

The semiconductor layer may include a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. The semiconductor substrate 101 may be a silicon substrate, in particular, a single crystal silicon substrate. Other materials may be used to form the semiconductor substrate 101 such as, for example, germanium, silicon/germanium, gallium phosphate, gallium arsenide, etc.

Gate electrodes 102 of dummy transistors are formed above the substrate 101. The gate electrodes 102 include one or more electrode materials, in particular, metal and polysilicon. Moreover, a work function adjusting material 103 is provided. The work function adjusting material 103 may include an appropriate transition metal nitride, for example, those from Groups 4-6 in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN) and the like, with a thickness of about 1-60 nm. The gate electrodes 102 are formed on a gate dielectric, for example, a high-k gate dielectric 104. Spacer liners 105 are formed over sidewalls of the gate electrodes 102. For example, the spacer liners 105 may be formed of silicon nitride. The individual gate electrodes 102 are separated from each other by dielectric layers 106, for example oxide layers. It should be noted that the gate electrodes 102 of the dummy transistors may be formed within the replacement gate manufacturing process of multiple transistor devices. Different from the transistor devices, the dummy transistors do not function as transistors. For example, the dummy transistors do not have source/drain regions. The transistor devices may be N-channel transistors or P-channel transistors.

The configuration shown in FIG. 1*a* may be formed as follows, for example. Description is made for one gate electrode structure of the gate electrodes 102 shown in FIG. 1*a*. A thin insulating silicon oxide liner may be formed on the surface of a substrate. The substrate may be a substrate as described above. The silicon oxide liner s provided as a sacrificial layer to facilitate the deposition of subsequent intermediate layers in the formation of the replacement metal gate structure thereon. Before or after deposition of the silicon oxide liner, shallow trench isolations (STI) separating the regions of the gate electrodes 102 to be formed may be formed. Next, a dielectric layer 106, for example an oxide layer, may be formed overlying the substrate and the silicon oxide liner. The dielectric layer may include a deposited silicon oxide, silicon nitride or silicon oxynitride, or another material suitable for providing electrical isolation between semiconductive structures. The dielectric layer may be blanket-deposited using, for example, a plasma enhanced chemical vapor deposition (PECVD), a low pressure chemical vapor deposition (LPCVD), or a chemical vapor deposition (CVD) process. The dielectric layer may include a silicon oxide material and have a thickness of about 50 nm to about 1 micron, for example a thickness of about 100-500 nm.

Next, above the semiconductor substrate 101 and the silicon oxide layer, a "dummy gate" stack may be provided. The dummy gate stack may include a "dummy" amorphous or polycrystalline silicon gate structure that may be capped by a hard mask. The hard mask may be formed of, for example, various types of materials, including, silicon oxynitride, amorphous silicon, silicon oxide, silicon nitride and the like. The dummy gate structure may be about 10-70 nm thick, and the hard mask may be about 10-200 nm thick. The dummy gate stack may further include sidewall spacers (spacer liners) 105 which are present on either sides of the dummy gate structure and the hard mask. The sidewall spacers 105 may be formed from a spacer-forming layer, which itself is formed via the blanket deposition of silicon nitride, silicon oxide or another suitable dielectric material. The spacer-forming layer is next subjected to a series of etching steps to form sidewall spacers. For example, an anisotropic or directional etch is performed to remove selected portions of the spacer-forming layer to thereby create sidewall spacers 105 adjacent opposing sides of the dummy gate structure and the above-mentioned hard mask. The space between the formed sidewall spacers, and thus the width of the dummy gate structure and the hard mask may, for example, be between about 20 nm and about 1 μm.

In particular, the gate electrodes 102 are formed within the process of forming transistor devices. For the transistor devices, source and drain regions may be formed by appropriate implantation processes and anneal activation of the dopants. Halo implant regions are also formed if desired. It goes without saying that, for the capacitor structures to be formed, no source and drain regions need to be formed at all, i.e., the gate electrodes 102 of the dummy transistors are not neighbored by source/drain implants within the semiconductor substrate 101.

A next step may consist of removing the dummy gate stack and the portion of the oxide liner underneath the dummy gate stack to form an opening within the dielectric layer. The hard mask and the dummy gate may be etched using a suitable etch chemistry, as is known in the art, thus forming the opening within the dielectric layer, the opening being defined between the sidewall spacers 105. Regarding the removal of the silicon oxide layer, the silicon oxide may be removed in a solution of hydrofluoric (HF) acid, HF acid is used to etch silicon oxide ($SiO_2$) films on silicon (Si) substrates, for example, because the HF acid will etch the $SiO_2$ without attacking the Si surface. The HF acid may typically be diluted with deionized water in order to slow down the etch rate of the $SiO_2$, thereby ensuring better etch uniformity. In one embodiment, the dilution ratio ranges from 1:1 $HF:H_2O$ to 300:1 $H_2O:HF$. Alternatively, the HF acid may be diluted with ammonium fluoride ($NH_4F$). Moreover, the silicon may be removed using TMAH, ammonium hydroxide or potassium hydroxide.

The method may continue with the formation of a thermal oxide layer over the silicon substrate in the region of the opening (this thermal oxide layer is not shown in FIG. 1*a*). For example, thermal oxidation is typically performed in a furnace or a rapid thermal processor at an elevated temperature (for example from about 700-1100° C.) in the presence of an oxide forming material, such as an oxidizing ambient.

The method may continue with a step of forming the replacement gate structure. In the opening and above the thermal oxide layer, a high-k material layer may be deposited as a barrier layer to prevent electrical leakage from the replacement metal gate to be deposited. The high-k material layer may include a hafnium (Hf) or zirconium (Zr) oxide, or any other metal oxide with a sufficiently high dielectric constant as are well known in the art. The high-k material layer may be deposited by any technique known in the art that provides for conformal deposition thereof in the opening. The high-k material layer may be deposited using atomic layer deposition (ALD). The gate dielectric 104 shown in FIG. 1a may include or consist of the high-k material layer.

Next one or more work function material layers 103 may thereafter be deposited, patterned and etched over the high-k layer. For example, a layer of a work function material is deposited over the high-k layer. Various work function materials, provided in various layers, are known in the art, and the present disclosure is not intended to be limited to any work function material or any number of layers of work function materials. Further, with regard to any embodiment, it will be appreciated that the work function metal aye should be provided at a sufficient thickness so as to set the correct threshold voltage ($V_t$). Thereafter, low-resistance metal gate material fill layer, such as tungsten or aluminum, may be deposited to fill the opening thus completing the replacement metal gate structure shown in FIG. 1a. In fact, the replacement metal gate structure may include any commonly used gate material including, but not limited to, silicon dioxide ($SiO_2$), silicon nitride (SiN) of any other material now known or later developed. For example, the metal gate electrode materials may include one or more layers of titanium (Ti), titanium nitride (TiN), titanium-aluminum (TiAl), aluminum (Al), aluminum nitride (AlN), tungsten (W), tantalum (Ta), tantalum nitride (TaN), tantalum carbide (TaC), tantalum carbonitride (TaCN), tantalum silicon nitride (TaSiN), tantalum silicide (TaSi) and the like. The gate material of the dummy transistors may be the same material used for the formation of N-channel or P-channel transistors formed on the same wafer as the capacitor structure to be formed in the described example.

Figure 1B:
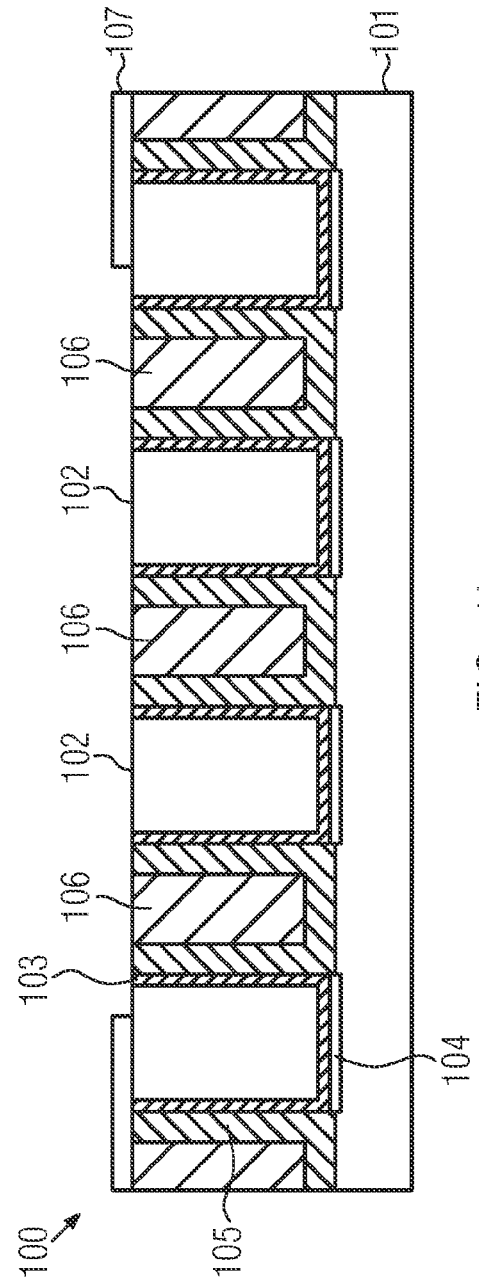

As shown in FIG. 1b, a mask 107, for example a TiN mask, is deposited on the semiconductor structure 100 shown in FIG. 1a and it is patterned in order to expose a region of the semiconductor structure 100 where a capacitor or multiple capacitors are to be formed according to the present disclosure.

After deposition of the mask 107, the oxide 106 separating the gate electrodes 102 is removed, as shown in FIG. 1c. Removal of the oxide 106 may be performed by high density plasma etching, for example. Next, the spacer liners 105 shown in FIGS. 1a and 1b are removed from the exposed sidewalls of the trenches resulting from the removal of the oxide 106, as shown in FIG. 1d. The removal of the spacer liners 105, for example formed as silicon nitride layers, may be achieved by reactive ion etching, particularly, using a plasma comprising $SF_6$, for example, an $SF_6/O_2$ plasma.

FIG. 1e shows the semiconductor structure 100 in a further developed stage. After removal of the spacer liners 105, a high-k material 108 is formed over the semiconductor structure 100. In particular, the work function adjusting material 103 at the sidewalls of the gate electrodes 102 is coated by the high-k material 108. Moreover, the exposed top surfaces of the gate electrodes 102 and the exposed upper surfaces of the substrate 101 between the electrode structures 102 are coated by the high-k material 108. The high-k material 108 may have a dielectric constant k of at least 10 and may include or be made of tantalum oxide, hafnium oxide, zirconium oxide, titanium oxide, aluminum oxide or hafnium silicate, for example.

Next, a metal layer 109 is formed on the semiconductor structure 100, as shown in FIG. 1f. The metal layer 109 may include or be made of a metal or metal compound comprising aluminum or tungsten. After chemical mechanical polishing, the configuration shown in FIG. 1g is obtained. After planarization, an interlayer dielectric 110 is formed on the semiconductor structure 100, as shown in FIG. 1h. The interlayer dielectric 110 may include a deposited silicon oxide, silicon nitride or silicon oxynitride, or another material suitable for providing electrical isolation between semiconductive structures. The interlayer dielectric 110 may be blanket-deposited using, for example, a PECVD, LPCVD or CVD process. In one embodiment, the interlayer dielectric 110 includes a silicon oxide material and has a thickness of about 50 nm to about 1 micron, for example, a thickness of about 100-500 nm. Electric contacting to both the gate electrodes 102 and the metal layer 109 may be achieved by forming contacts in the interlayer dielectric 110 and filling the same with some contact material 111, for example, aluminum or copper, as shown in FIG. 1i.

As illustrated in FIG. 1j, by the thus obtained configuration, a capacitor structure 120 is formed that includes a gate electrode 102 of a dummy transistor as a first capacitor electrode, a metal layer 109 as a second capacitor electrode and part of the work function adjusting material 103 and the high-k material 108 as a capacitor insulator. Thereby, a vertical capacitor structure 120 is formed that does not suffer from capacity restrictions due to reduction of available surface areas for the capacitor dielectric (insulator) caused by the ongoing demands for miniaturization of semiconductor devices. Moreover, the formation of the capacitor may readily be integrated in the process flow for the gate-last manufacture (replacement gate manufacture) of transistor devices and dummy transistors. A very compact design is obtained for the embedded capacitors. Furthermore, the formation in the context of the gate-last manufacture of transistor devices allows for the employment of high-k capacitor insulators, thereby increasing the capacitance significantly as compared to the art.

Figure 2:
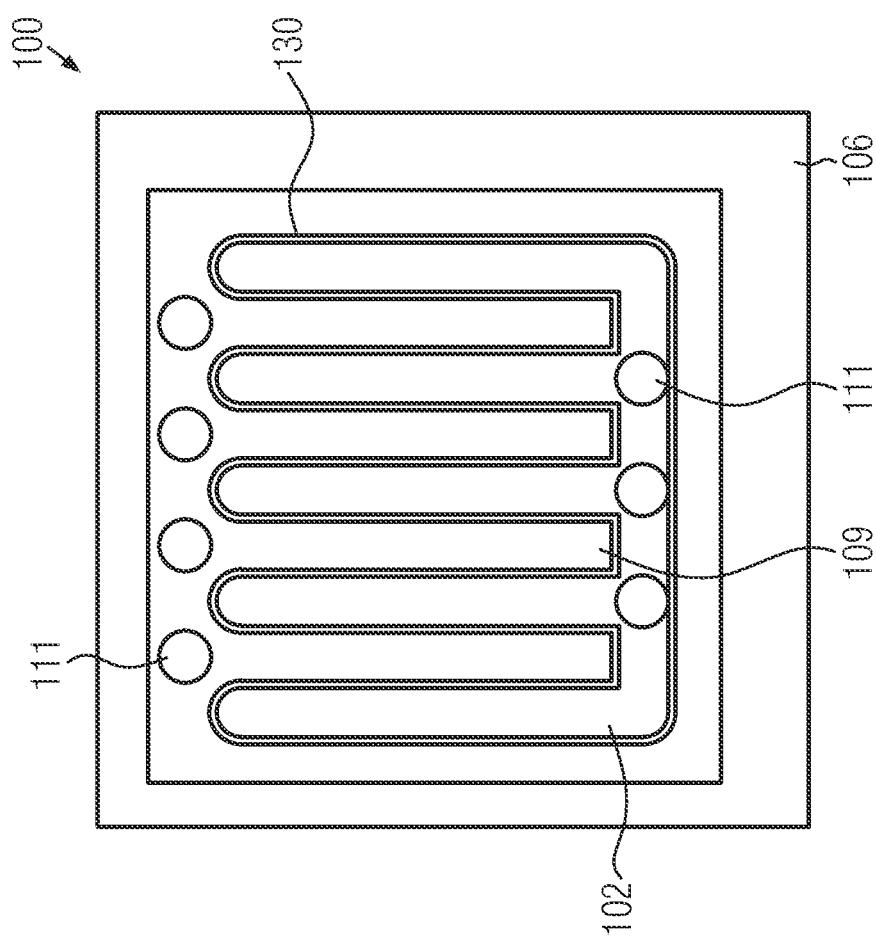
FIG. 2 shows a top view of a semiconductor structure comprising a capacitor formed according to an exemplary manufacturing method of the present disclosure.

FIG. 2 illustrates the resulting semiconductor device structure 100 comprising gate electrodes 102 of dummy transistors and capacitors 120 comprising the gate electrodes 102, metal layers 109 arranged in interspaces between the gate electrodes 102 and capacitor insulators 130 consisting of the work function adjusting material 103 and the high-k material 108 shown in FIGS. 1i and 1j.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method of manufacturing a semiconductor device, comprising:
   forming a gate electrode of a dummy transistor device on a semiconductor substrate;
   forming a high-k material layer over and adjacent to said gate electrode; and
   forming a metal layer on said high-k material layer over and adjacent to said gate electrode to form a capacitor.

2. The method of claim 1, further comprising forming a work function adjusting layer below and at sidewalls of said gate electrode before forming said high-k material layer.

3. The method of claim 2, wherein said work function adjusting layer comprises a transition metal nitride.

4. The method of claim 1, wherein forming said gate electrode comprises forming a dummy electrode, forming sidewall spacers at sidewalls of said dummy electrode, removing said dummy electrode, thereby forming an opening surrounded by said sidewall spacers, and filling said opening with a gate electrode material.

5. The method of claim 1, further comprising forming an oxide layer adjacent to said sidewall spacers in an area where an electrode of said capacitor has to be formed before removing said dummy gate electrode and removing said oxide layer after filling said opening with said gate electrode material.

6. The method of claim 2, wherein forming said gate electrode comprises forming a dummy electrode, forming sidewall spacers at sidewalls of said dummy electrode, removing said dummy electrode, thereby forming an opening surrounded by said sidewall spacers, depositing said work function adjusting layer in said opening and subsequently filling said opening with a gate electrode material.

7. The method of claim 6, further comprising forming an oxide layer adjacent to said sidewall spacers before removing said dummy gate electrode and removing said oxide layer after filling said opening with said gate electrode material.

8. The method of claim 1, wherein said high-k material layer has a dielectric constant k of more than 5 or more than 10.

9. The method of claim 1, comprising forming a plurality of gate electrodes, forming said high-k material layer over and adjacent to said plurality of electrodes and forming said metal layer on said high-k material layer over and adjacent to said electrodes to form a capacitor.

10. The method of claim 1, further comprising forming a dielectric layer on said metal layer, forming contacts in said dielectric layer to said gate electrode and said metal layer and filling said contacts with a contact material.

11. A method of forming a capacitor, comprising:
forming a gate dielectric on a semiconductor substrate;
forming a dummy gate electrode on said gate dielectric;
forming sidewall spacers at sidewalls of said dummy gate electrode;
removing said dummy gate electrode, thereby forming an opening between said sidewall spacers;
forming a work function adjusting layer in said opening;
forming a gate electrode on said work function adjusting layer;
removing said sidewall spacers;
forming a high-k material layer on said work function adjusting layer over sidewalls of said gate electrode; and
forming a metal layer on said high-k material layer over and adjacent to said gate electrode to form a capacitor.

12. The method of claim 11, further comprising forming an oxide layer in said sidewall spacers before forming said gate electrode and removing said oxide layer after forming said gate electrode.

13. The method of claim 11, wherein said high-k material layer has a dielectric constant k of more than 5 or more than 10.

14. The method of claim 11, further comprising forming a dielectric layer on said metal layer, forming contacts in said dielectric layer to said gate electrode and said metal layer and filling said contacts with a contact material.

15. The method of claim 11, wherein said work function adjusting layer comprises a transition metal nitride.

16. A semiconductor device comprising a capacitor, said semiconductor device comprising:
a dummy transistor comprising a gate electrode;
a high-k material layer covering said gate electrode;
a metal layer formed on said high-k material layer; and
a work function adjusting layer formed on sidewalls of said gate electrode and under said high-k material layer.

17. The semiconductor device of claim 16, wherein said high-k material layer has a dielectric constant k of more than 5 or more than 10.

18. The semiconductor device of claim 16, further comprising a dielectric layer formed on said metal layer and contacts to said gate electrode formed in said dielectric layer and filled with a contact material.

19. The semiconductor device of claim 16, further comprising a plurality of transistor devices.

20. The semiconductor device of claim 16, wherein said work function adjusting layer comprises a transition metal nitride.

21. A semiconductor device comprising a capacitor, said semiconductor device comprising:
a dummy transistor comprising a gate electrode;
a high-k material layer covering said gate electrode;
a metal layer formed on said high-k material layer;
a dielectric layer formed on said metal layer and contacts to said gate electrode formed in said dielectric layer and filled with a contact material, and
a work function adjusting layer positioned on sidewalls of said gate electrode and under said high-k material layer.

22. The semiconductor device of claim 21, wherein said high-k material layer has a dielectric constant k of more than 5 or more than 10.

23. The semiconductor device of claim 21, further comprising a plurality of transistor devices.

24. The semiconductor device of claim 21, wherein said work function adjusting layer comprises a transition metal nitride.

* * * * *